(12) United States Patent
Tang

(10) Patent No.: US 9,939,690 B2
(45) Date of Patent: Apr. 10, 2018

(54) ARRAY SUBSTRATE AND DISPLAY DEVICE

(71) Applicant: Shenzhen China Star Optoelectronics Technology Co., Ltd., Shenzhen, Guangdong (CN)

(72) Inventor: Yuejun Tang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/418,199

(22) PCT Filed: Jan. 16, 2015

(86) PCT No.: PCT/CN2015/070940
§ 371 (c)(1),
(2) Date: May 9, 2016

(87) PCT Pub. No.: WO2016/106873
PCT Pub. Date: Jul. 7, 2016

(65) Prior Publication Data
US 2016/0246126 A1  Aug. 25, 2016

(30) Foreign Application Priority Data
Dec. 31, 2014  (CN) ........................ 2014 1 0856599

(51) Int. Cl.
*G09G 3/36* (2006.01)
*G02F 1/1343* (2006.01)
(Continued)

(52) U.S. Cl.
CPC ...... *G02F 1/134309* (2013.01); *G02F 1/1337* (2013.01); *G02F 1/1368* (2013.01);
(Continued)

(58) Field of Classification Search
CPC ..................................................... G06F 3/013
See application file for complete search history.

(56) References Cited

U.S. PATENT DOCUMENTS 8,531,371 B2 *  9/2013  Yoon .................... G09G 3/3614
345/96
8,963,822 B2 *  2/2015  Yoon .................... G09G 3/3614
345/100
(Continued)

FOREIGN PATENT DOCUMENTS

CN        101071240 A    11/2007
CN        101382710 A     3/2009
(Continued)

OTHER PUBLICATIONS

International Search Report and Written Opinion, dated Jan. 16, 2015, China.

*Primary Examiner* — Nan-Ying Yang
(74) *Attorney, Agent, or Firm* — Kim Winston LLP

(57) ABSTRACT

Disclosed are an array substrate and a display device. The array substrate comprises a plurality of sub-pixel units arranged in an array. Each of the sub-pixel units comprises a first transparent electrode and a second transparent electrode cooperating with each other, and a first switching element and a second switching element cooperating with each other. The signals provided by the first switching element and the second switching element are different, and are interchanged with each other each time after a given time period.

15 Claims, 4 Drawing Sheets

(51) Int. Cl.
*G02F 1/1337* (2006.01)
*G02F 1/1362* (2006.01)
*G02F 1/1368* (2006.01)
*H01L 27/12* (2006.01)
G02F 1/1335 (2006.01)
G02F 1/1333 (2006.01)

(52) U.S. Cl.
CPC ...... *G02F 1/13439* (2013.01); *G02F 1/13624* (2013.01); *G02F 1/134363* (2013.01); *G02F 1/136286* (2013.01); *H01L 27/124* (2013.01); G02F 1/133514 (2013.01); G02F 2001/133397 (2013.01); G02F 2001/134345 (2013.01); G02F 2001/134372 (2013.01); G09G 3/36 (2013.01); G09G 2320/0257 (2013.01)

(56) References Cited

U.S. PATENT DOCUMENTS

| | | | | |
|---|---|---|---|---|
| 2007/0262938 | A1* | 11/2007 | Kim | G02F 1/13624 345/92 |
| 2008/0002079 | A1* | 1/2008 | Kimura | G02B 6/0051 349/42 |
| 2008/0079679 | A1* | 4/2008 | Ozawa | G09G 3/3659 345/89 |

FOREIGN PATENT DOCUMENTS

| | | |
|---|---|---|
| CN | 101957527 A | 1/2011 |
| CN | 104240661 A | 12/2014 |

* cited by examiner

ARRAY SUBSTRATE AND DISPLAY DEVICE

The present application claims benefit of Chinese patent application CN201410856599.9, entitled "Array substrate and display device" and filed on Dec. 31, 2014, the entirety of which is incorporated herein by reference.

TECHNICAL FIELD

The present disclosure relates to the technical field of displays, and in particular, to an array substrate and a display device.

TECHNICAL BACKGROUND

Among flat-panel display devices, liquid crystal display panels (LCD panel), having the advantages of low thickness, light weight, low power consumption and low electromagnetic emission, are widely used in information devices such as cell phones, computers, televisions, personal digital assistant, etc.

Residual image is one of the obvious defects of the existing LCD panels. If a LCD panel displays a same frame for a long time, when the frame is switched to a next one, an image of said frame will remain faintly on the screen. This faint image is referred to as a residual image. The reason is that the polar particles in the LCD panel can move toward the upper substrate and the lower substrate of the LCD panel along a direction of the electric field, and gather at the surfaces of the upper substrate and the lower substrate, thus generating a DC residual voltage. When the density of the gathered polar particles reaches to such a degree that the DC residual voltage generated can affect the deflection angle of the liquid crystal molecules in the liquid crystal cell, the LCD panel will display images distortedly. Therefore, when the frame is switched to a next one, the gathered polar particles will remain at the surfaces of the substrates, and retain the original image, thereby leading to a residual image.

In the existing technologies, the defect of residual images of LCD panels can be overcome by optimizing the processing environment and conditions so as to reduce the content of impurities in the LCD panel, by optimizing the selection of materials, for example, selecting less pollutive encapsulating materials, steady liquid crystal materials containing less polar particles, or appropriate alignment film, so as to reduce the content of polar particles in the LCD panel, or by adjusting gamma voltage so as to reduce the difference among common electrode signals at different locations in the LCD panel, then reduce the difference of common electrode signals with different gray scales, and finally find out a most appropriate monochrome voltage to overcome the defect of residual images.

The inventor found that the methods of overcoming the defect of residual images in the existing technologies are limited by factors such as materials, processing, and manual error, and therefore cannot effectively overcome the defect of residual images.

SUMMARY OF THE INVENTION

The objective of the present disclosure is to provide an array substrate and a display device which can distinctly overcome the defect of residual images.

The present disclosure, on the one hand, provides an array substrate. The array substrate comprises a plurality of sub-pixel units arranged in an array, and each of the sub-pixel units comprises a first transparent electrode and a second transparent electrode cooperating with each other, and a first switching element and a second switching element cooperating with each other. The first switching element is connected to the first transparent electrode, and provides a pixel electrode signal or a common electrode signal for the first transparent electrode. The second switching element is connected to the second transparent electrode, and provides the common electrode signal or the pixel electrode signal for the second transparent electrode. The signals provided by the first switching element and the second switching element are different, and are interchanged with each other each time after a given time period.

Further, each time after a first presupposed time period, the first switching element is changed from providing the pixel electrode signal into providing the common electrode signal, and the second switching element is changed from providing the common electrode signal into providing the pixel electrode signal. Each time after a second presupposed time period, the first switching element is changed from providing the common electrode signal into providing the pixel electrode signal, and the second switching element is changed from providing the pixel electrode signal into providing the common electrode signal.

Further, each of the sub-pixel units is provided with a first data line and a first gate line, and a second data line and a second gate line. The first data line is connected to a source of the first switching element, and the first gate line is connected to a gate of the first switching element. The second data line is connected to a source of the second switching element, and the second gate line is connected to a gate of the second switching element.

Further, each of the sub-pixel units is provided with a data line, a first gate line, and a second gate line. The data line is connected to the sources of the first switching element and the second switching element. The first gate line is connected to the gate of the first switching element, and the second gate line is connected to the gate of the second switching element.

Further, each of the sub-pixel units is provided with a first data line, a second data line, and a gate line. The first data line is connected to the source of the first switching element; the second data line is connected to the source of the second switching element; and the gate line is connected to the gates of the first switching element and the second switching element.

Further, the first transparent electrode is a slit electrode, and the second transparent electrode is a board electrode. The first transparent electrode is located on the second transparent electrode.

Further, both the first transparent electrode and the second transparent electrode are slit electrodes, and are arranged with respect to each other in a staggered manner.

Further, the first presupposed time period and the second presupposed time period each are shorter or the same as a time period that is necessary for generating a residual image.

According to the present disclosure, the following beneficial effects can be achieved. The embodiments of the present disclosure provide an array substrate. Each of the sub-pixel units of the array substrate comprises a first transparent electrode and a second transparent electrode which cooperate with each other, and is provided with a first switching element and a second switching element. The first switching element is connected to the first transparent electrode, and provides a pixel electrode signal or a common electrode signal for the first transparent electrode. The second switching element is connected to the second transparent electrode, and provides the common electrode signal or the pixel electrode signal for the second transparent electrode. The signals provided by the first switching element and the second switching element are different, and are interchanged with each other each time after a presupposed time period. Each time after the signals provided by the first transparent electrode and the second transparent electrode are interchanged with each other, the polar particles gathered by the attraction of the first transparent electrode in a previous stage will scatter, or electric charges of the polar particles are neutralized. This is the same with respect to the second transparent electrode. In this way, residual images caused by the accumulation of polar particles will be prevented essentially, thereby improving the image quality of the display device.

The present disclosure, on the other hand, provides a display device comprising an aforesaid array substrate.

Further, the display device comprises a color filter substrate assembled together with the array substrate.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

For further illustrating the technical solutions provided in the embodiments of the present disclosure, a brief introduction will be given below to the accompanying drawings involved in the embodiments.

DETAILED DESCRIPTION OF THE EMBODIMENTS

The present disclosure will be explained in detail with reference to the embodiments and the accompanying drawings, so as to fully understand how to solve the technical problem and achieve the technical effects by the technical means according to the present disclosure, and thus implement the same. It should be noted that as long as there is no structural conflict, any of the embodiments and any of the technical features thereof may be combined with one another, and the technical solutions obtained therefrom all fall within the scope of the present disclosure.

Figure 1:
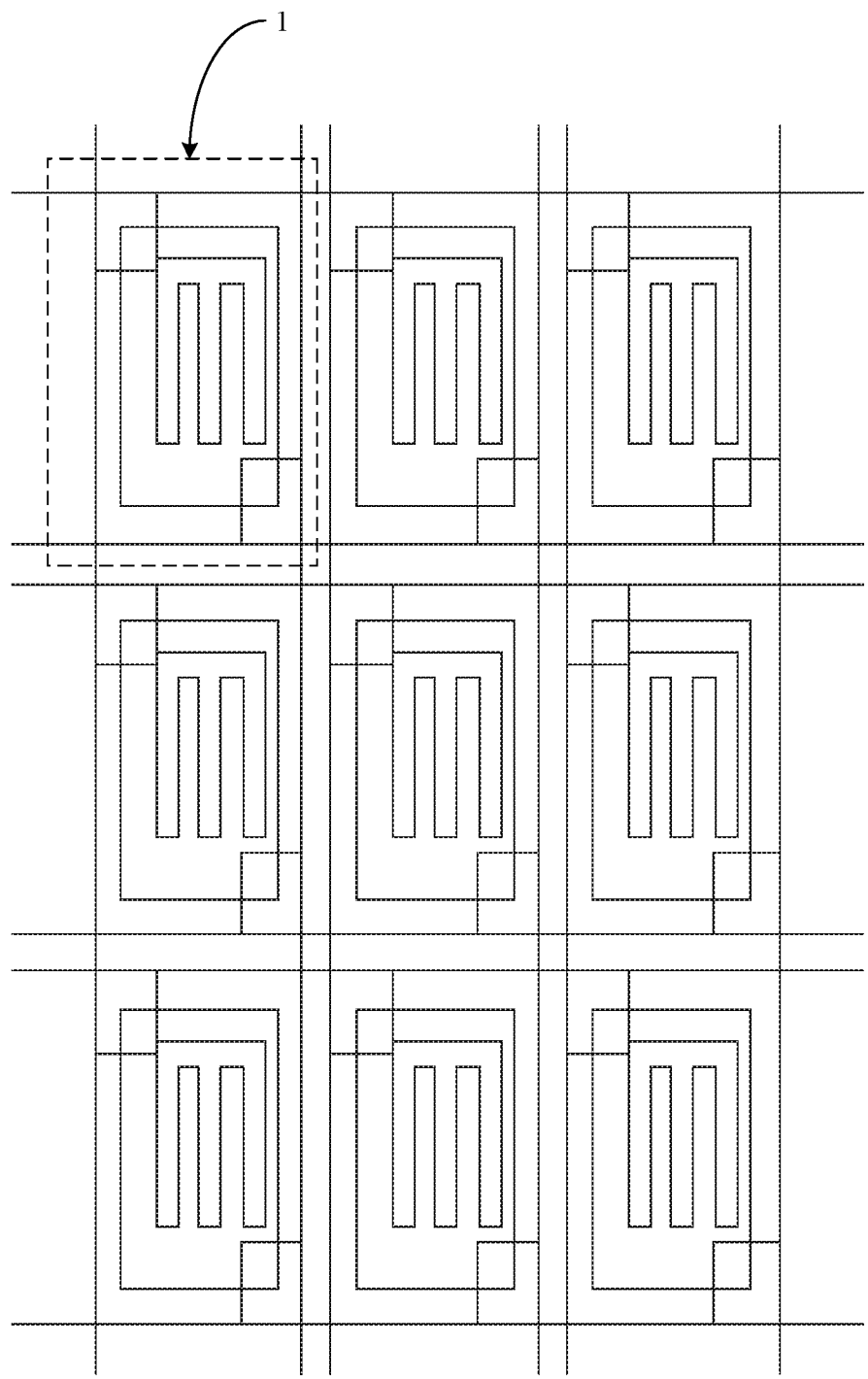
FIG. 1 schematically shows the structure of an array substrate according to the embodiments of the present disclosure.
Figure 2:
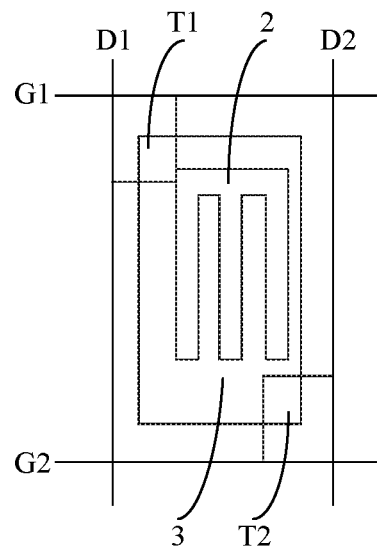
FIGS. 2 to 4 schematically show three structures of a sub-pixel unit according to the embodiments of the present disclosure respectively.

The present embodiment provides an array substrate. As shown in FIG. 1, the array substrate comprises a plurality of sub-pixel units 1 arranged in an array. As shown in FIG. 2, each of the sub-pixel units 1 comprises a first transparent electrode 2 and a second transparent electrode 3 cooperating with each other, and a first switching element T1 and a second switching element T2 cooperating with each other.

Specifically, the first switching element T1 is connected to the first transparent electrode 2, and provides a pixel electrode signal or a common electrode signal for the first transparent electrode 2. The second switching element T2 is connected to the second transparent electrode 3, and provides the common electrode signal or the pixel electrode signal for the second transparent electrode 3. The signals provided by the first switching element T1 and the second switching element T2 are different, and are interchanged with each other each time after a given time period.

In the present embodiment, as shown in FIG. 2, each of the sub-pixel units 1 comprises the first switching element T1 and the second switching element T2, which are arranged respectively corresponding to the first transparent electrode 2 and the second transparent electrode 3. A drain of the first switching element T1 is connected to the first transparent electrode 2, and provides a signal for the first transparent electrode 2. A drain of the second switching element T2 is connected to the second transparent electrode 3, and provides a signal for the second transparent electrode 3.

Accordingly, as shown in FIG. 2, each of the sub-pixel units 1 is provided with a first data line D1 and a first gate line G1, and a second data line G1 and a second gate line G2. The first data line D1 is connected to a source of the first switching element T1, and the first gate line G1 is connected to a gate of the first switching element T1. The second data line D2 is connected to a source of the second switching element T2, and the second gate line G2 is connected to a gate of the second switching element T2.

As shown in FIG. 2, the first data line D1 and the second data line D2 can be arranged respectively on the right side and the left side of the sub-pixel unit 1, and the first gate line G1 and the second gate line G2 can be arranged respectively on the top side and lower side of the sub-pixel unit 1. In this case, the first switching element T1 can be located at the intersection of the first data line D1 and the first gate line G1, for example, as shown in FIG. 2, at the top left corner of the sub-pixel unit 1. Accordingly, the second switching element T2 can be located at the intersection of the second data line D2 and the second gate line G2, for example, as shown in FIG. 2, at the lower right corner of the sub-pixel unit 1. Obviously, if the locations of some of or all of the first data line D1, the first gate line G1, the second data line D2, and the second gate line G2 in FIG. 2 are changed, the locations of the first switching element T1 and the second switching element T2 in the sub-pixel unit 1 might also be changed. The present embodiment is not restricted by the shown arrangement.

The first switching element T1 and the second switching element T2 can be preferably a thin film transistor (TFT).

Figure 3:
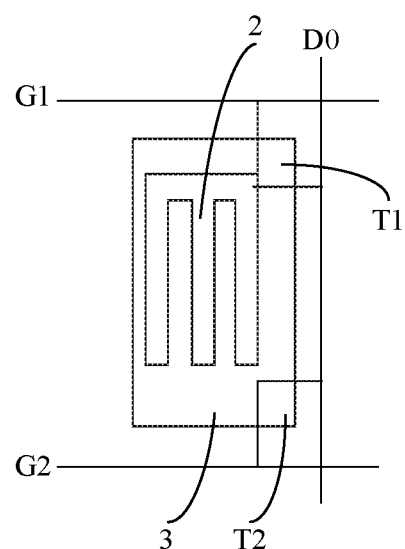

In order to improve the aperture ratio of each of the sub-pixel units, as shown in FIG. 3, each of the sub-pixel units can be provided with merely a data line D0, a first gate line G1, and a second gate line G2. The data line D0 is connected to the sources of the first switching element T1 and the second switching element T2; the first gate line G1 is connected to the gate of the first switching element T1; and the second gate line G2 is connected to the gate of the second switching element T2.

In this case, the data line D0 is shared by the first switching element T1 and the second switching element T2, and outputs an electrode signal corresponding to the first switching element T1 and an electrode signal corresponding to the second switching element T2 alternatively. That is, when there is a gate drive signal in the first gate line G1, the data line D0 should output the electrode signal corresponding to the first switching element T1; and when there is a gate drive signal in the second gate line G2, the data line D0 should output the electrode signal corresponding to the second switching element T2, thereby ensuring that the first transparent electrode 2 and the second transparent electrode 3 can be provided with corresponding electrode signals, and that the array substrate can work normally.

Figure 4:
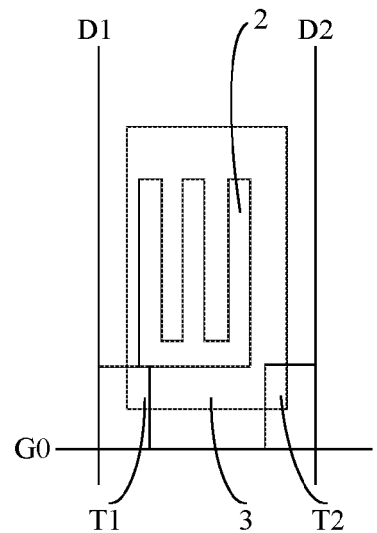

Likewise, as shown in FIG. 4, each of the sub-pixel units can be provided with merely a first data line D1, a second data line D2, and a gate line G0. The first data line D1 is connected to the source of the first switching element T1; the second data line D2 is connected to the source of the second switching element T2; and the gate line G0 is connected to the gates of the first switching element T1 and the second switching element T2.

In this case, the gate line G0 is shared by the first switching element T1 and the second switching element T2, and drives the first switching element T1 and the second switching element T2 simultaneously. The first data line D1 provides an electrode signal for the first switching element T1, and the second data line D2 provides an electrode signal for the second switching element T2, thereby ensuring that the first transparent electrode 2 and the second transparent electrode 3 can be provided with corresponding electrode signal.

Specifically, in the present embodiment, each time after a first presupposed time period t1, the first switching element T1 is changed from providing the pixel electrode signal into providing the common electrode signal, and the second switching element T2 is changed from providing the common electrode signal into providing the pixel electrode signal. Each time after a second presupposed time period t2, the first switching element T1 is changed from providing the common electrode signal into providing the pixel electrode signal, and the second switching element T2 is changed from providing the pixel electrode signal into providing the common electrode signal. The first presupposed time period t1 and the second presupposed time period t2 can be the same or different, but both of them should be shorter or the same as a time period that is necessary for generating a residual image, so as to prevent an occurrence of residual image on the display device comprising the array substrate. The first presupposed time period t1 and the second presupposed time period t2 can be a time period for displaying one frame, and can be several seconds, several minutes, or even one hour. The time period necessary for generating a residual image is dependent on display devices, and the present embodiment is not restricted in this regard.

In the present embodiment, as shown in FIG. 2, 3, or 4, the driving mode of the array substrate can be a fringe field switching mode (FFS mode). The core technical characteristics of FFS mode can be described as: through a multidimensional electric field formed by the electric field generated at the edges of the slit electrode in the same plane, and the electric field generated between the slit electrode and the board electrode, all the orientated liquid crystal molecules among the slit electrodes and right above the electrode in the liquid crystal cell can be rotated, so that the efficiency and transparency of the liquid crystal display device can be improved. FFS mode can improve the image quality of display devices such as liquid crystal display panels, and enable the display devices to have advantages such as high resolution, high transmittance, low power consumption, broad visual angle, high aperture ratio, low color difference, no push Mura, etc.

Therefore, the first transparent electrode 2 can be a slit electrode, and the second transparent electrode 3 can be a board electrode. In this case, the first transparent electrode 2 is located on the second transparent electrode 3. To ensure that the first transparent electrode 2 is electrically insulated from the second transparent electrode 3, an insulating layer 5 can be provided between the first transparent electrode 2 and the second transparent electrode 3.

In addition, the first transparent electrode 2 and the second transparent electrode 3 can be also covered with an alignment film 6 for providing a pretilt angle for the liquid crystal molecules, so as to render the rotating directions of the liquid crystal molecules more uniform.

Figure 5:
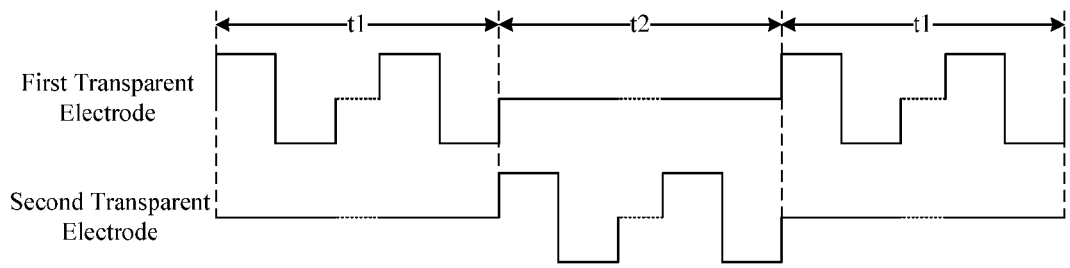
FIG. 5 is a signal timing chart according to the embodiments of the present disclosure.
Figure 6:
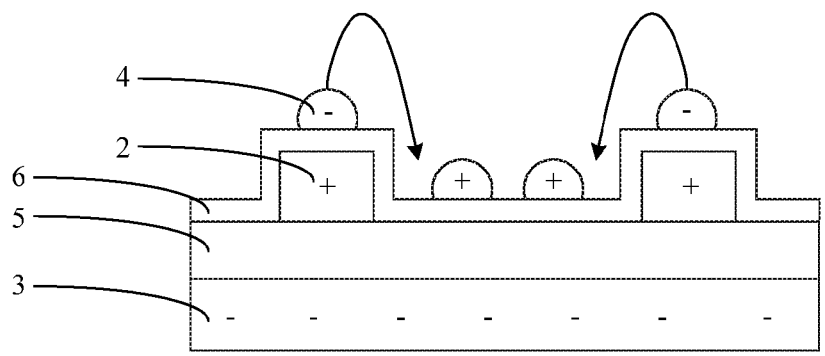
FIGS. 6 and 7 both schematically show a first transparent electrode and a second transparent electrode which cooperate with each other according to the embodiments of the present disclosure.

In the present embodiment, for example, as shown in FIG. 5, in the first presupposed time period t1, the first transparent electrode 2 receives the pixel electrode signal, and thus serves as a pixel electrode. Accordingly, the second transparent electrode 3 receives the common electrode signal, and thus serves as a common electrode. As shown in FIG. 6, in view of the limitations of pixel structure and processing techniques, there is a DC bias voltage in the pixel electrode signal received by the first transparent electrode 2, which renders the electric potential of the first transparent electrode 2 higher than that of the second transparent electrode 3. Since there are polar particles in the liquid crystal display panel, in this case, the DC bias voltage on the first transparent electrode 2 will attract the polar particles with negative charges, and the second transparent electrode 3 will attract the polar particles with positive charges. All the polar particles attracted by the first transparent electrode 2 or the second transparent electrode 3 will be retained at the surface of the alignment film 6.

Figure 7:
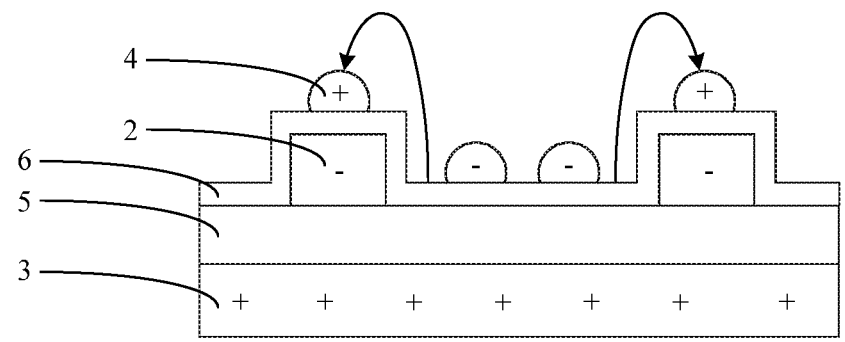

When the first presupposed time period lapses and the second presupposed time period starts, the first transparent electrode 2 receives the common electrode signal, and serves as a common electrode, while the second transparent electrode 3 receives the pixel electrode signal, and serves as the pixel electrode. In this case, as shown in FIG. 7, the electric potential of the second transparent electrode 3 is higher than that of the first transparent electrode 2, which enables the polar particles with positive charges which are attracted by the second transparent electrode 3 previously to be neutralized, or to disperse under the repulsion of the second transparent electrode 3. This is the same with respect to the first transparent electrode 2. Obviously, the array substrate provided by the present embodiment can distinctly overcome the defect of residual images on the display device, and it might be said even that it essentially solves the problem of residual images on the display device.

Figure 8:
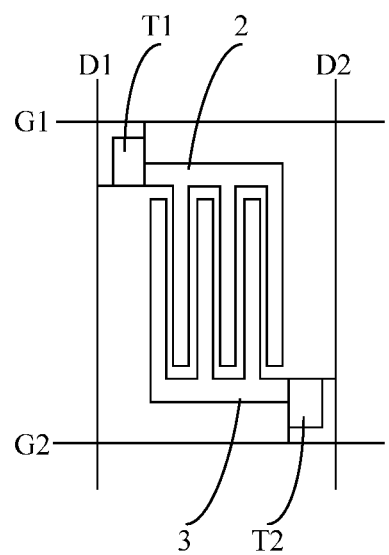
FIG. 8 schematically shows another structure of the sub-pixel unit according to the embodiments of the present disclosure.

In addition, in the present embodiment, the driving mode of the array substrate can be an in-plane switching mode (IPS mode). The most important feature of the IPS is that, unlike other driving modes in which two electrodes are located at different layers and are spatially arranged, the two electrodes in the IPS mode are located at a same layer of a same array substrate. As shown in FIG. 8, both the first transparent electrode 2 and the second transparent electrode 3 of each sub-pixel unit in the array substrate are slit electrodes, and they are arranged with respect to each other in a staggered manner.

To conclude, the technical solution of the present embodiment provides an array substrate. Each of the sub-pixel units of the array substrate comprises a first transparent electrode and a second transparent electrode cooperating with each other, and is provided with a first switching element and a second switching element. The first switching element is connected to the first transparent electrode, and provides a pixel electrode signal or a common electrode signal for the first transparent electrode. The second switching element is connected to the second transparent electrode, and provides the common electrode signal or the pixel electrode signal for the second transparent electrode. The signals provided by the first switching element and the second switching element are different, and are interchanged with each other each time after a presupposed time period. Each time after the signals provided by the first transparent electrode and the second transparent electrode are interchanged with each other, the polar particles gathered by the attraction of the first transparent electrode in a previous stage will scatter, or electric charges of the polar particles are neutralized. This is the same with respect to the second transparent electrode. In this way, residual images caused by the accumulation of polar particles will be prevented essentially, thereby improving the image quality of the display device.

The present embodiment further provides a display device comprising the above array substrate. The display device can be used in liquid crystal televisions, liquid crystal display devices, cell phones, tablet PCs, etc.

The above embodiments are described only for better understanding, rather than restricting the present disclosure. Anyone skilled in the art can make amendments to the implementing forms or details without departing from the spirit and scope of the present disclosure. The scope of the present disclosure should still be subject to the scope defined in the claims.

LIST OF REFERENCE SIGNS

1—sub-pixel unit;
2—first transparent electrode;
3—second transparent electrode;
4—polar particles;
5—insulating layer;
6—alignment film.

The invention claimed is:

1. An array substrate, comprising a plurality of sub-pixel units arranged in an array, each of the sub-pixel units comprising a first transparent electrode and a second transparent electrode cooperating with each other, and a first switching element and a second switching element cooperating with each other,
   wherein the first switching element is connected to the first transparent electrode, and provides a pixel electrode signal or a common electrode signal for the first transparent electrode,
   the second switching element is connected to the second transparent electrode, and provides the common electrode signal or the pixel electrode signal for the second transparent electrode, and
   the signals provided by the first switching element and the second switching element are different, and are interchanged with each other each time after a given time period, wherein
   each time after a first presupposed time period, the first switching element is changed from providing the pixel electrode signal into providing the common electrode signal, and the second switching element is changed from providing the common electrode signal into providing the pixel electrode signal, and
   each time after a second presupposed time period, the first switching element is changed from providing the common electrode signal into providing the pixel electrode signal, and the second switching element is changed from providing the pixel electrode signal into providing the common electrode signal; and
   the first presupposed time period is not the same as the second presupposed time period.

2. The array substrate according to claim 1, wherein each of the sub-pixel units is provided with a first data line and a first gate line, and a second data line and a second gate line,
   wherein the first data line is connected to a source of the first switching element, and the first gate line is connected to a gate of the first switching element, and
   the second data line is connected to a source of the second switching element, and the second gate line is connected to a gate of the second switching element.

3. The array substrate according to claim 1, wherein each of the sub-pixel units is provided with a data line, a first gate line, and a second gate line, and
   wherein the data line is connected to the sources of the first switching element and the second switching element, the first gate line is connected to the gate of the first switching element, and the second gate line is connected to the gate of the second switching element.

4. The array substrate according to claim 1, wherein each of the sub-pixel units is provided with a first data line, a second data line, and a gate line, and
   wherein the first data line is connected to the source of the first switching element, the second data line is connected to the source of the second switching element, and the gate line is connected to the gates of the first switching element and the second switching element.

5. The array substrate according to claim 1, wherein the first transparent electrode is a slit electrode, and the second transparent electrode is a board electrode, the first transparent electrode being located on the second transparent electrode.

6. The array substrate according to claim 1, wherein both the first transparent electrode and the second transparent electrode are slit electrodes, and are arranged with respect to each other in a staggered manner.

7. The array substrate according to claim 1, wherein the first presupposed time period and the second presupposed time period each are shorter or the same as a time period that is necessary for generating a residual image.

8. A display device, comprising an array substrate, wherein the array substrate comprises a plurality of sub-pixel units arranged in an array, each of the sub-pixel units comprising a first transparent electrode and a second transparent electrode cooperating with each other, and a first switching element and a second switching element cooperating with each other,
   wherein the first switching element is connected to the first transparent electrode, and provides a pixel electrode signal or a common electrode signal for the first transparent electrode,
   the second switching element is connected to the second transparent electrode, and provides the common electrode signal or the pixel electrode signal for the second transparent electrode, and
   the signals provided by the first switching element and the second switching element are different, and are interchanged with each other each time after a given time period, wherein
   each time after a first presupposed time period, the first switching element is changed from providing the pixel electrode signal into providing the common electrode signal, and the second switching element is changed from providing the common electrode signal into providing the pixel electrode signal, and each time after a second presupposed time period, the first switching element is changed from providing the common electrode signal into providing the pixel electrode signal, and the second switching element is changed from providing the pixel electrode signal into providing the common electrode signal; and the first presupposed time period is not the same as the second presupposed time period.

9. The display device according to claim 8, further comprising a color filter substrate assembled together with the array substrate.

10. The display device according to claim 8, characterized in that:

each of the sub-pixel units is provided with a first data line and a first gate line, and a second data line and a second gate line, wherein the first data line is connected to a source of the first switching element, and the first gate line is connected to a gate of the first switching element, and the second data line is connected to a source of the second switching element, and the second gate line is connected to a gate of the second switching element.

11. The display device according to claim 8, characterized in that:

each of the sub-pixel units is provided with a data line, a first gate line, and a second gate line, wherein the data line is connected to the sources of the first switching element and the second switching element, the first gate line is connected to the gate of the first switching element, and the second gate line is connected to the gate of the second switching element.

12. The display device according to claim 8, characterized in that:

each of the sub-pixel units is provided with a first data line, a second data line, and a gate line, wherein the first data line is connected to the source of the first switching element, the second data line is connected to the source of the second switching element, and the gate line is connected to the gates of the first switching element and the second switching element.

13. The display device according to claim 8, characterized in that:

the first transparent electrode is a slit electrode, and the second transparent electrode is a board electrode, the first transparent electrode being located on the second transparent electrode.

14. The display device according to claim 8, characterized in that:

the first transparent electrode and the second transparent electrode are slit electrodes, and are arranged with respect to each other in a staggered manner.

15. The display device according to claim 8, characterized in that:

the first presupposed time period and the second presupposed time period each are shorter or the same as a time period that is necessary for generating a residual image.

* * * * *